United States Patent [19]

Taneda et al.

[11] Patent Number: 5,248,637
[45] Date of Patent: Sep. 28, 1993

[54] HIGHLY HEAT RESISTANT GLASS FIBER AND PROCESS FOR ITS PRODUCTION

[75] Inventors: Naoki Taneda; Kouichi Numata; Takashi Mukaiyama, all of Yokohama, Japan

[73] Assignee: Asahi Glass Company Ltd., Tokyo, Japan

[21] Appl. No.: 873,206

[22] Filed: Apr. 24, 1992

[30] Foreign Application Priority Data

Apr. 24, 1991 [JP] Japan .................. 3-122273

[51] Int. Cl.$^5$ .................. C03C 3/06; C03C 13/02
[52] U.S. Cl. .................. 501/35; 501/38; 501/54
[58] Field of Search .................. 501/12, 35, 36, 38, 501/54

[56] References Cited

U.S. PATENT DOCUMENTS

| | | |
|---|---|---|
| 4,084,977 | 4/1978 | Freedman .................. 501/38 |
| 4,278,422 | 7/1981 | Thompson . |
| 4,797,376 | 1/1989 | Caldwell et al. . |

FOREIGN PATENT DOCUMENTS 0335422 10/1989 European Pat. Off. .
3142383 7/1982 Fed. Rep. of Germany .

OTHER PUBLICATIONS

Glastechnische Berichte, vol. 61, No. 8, Aug. 1988, pp. 218-222, M. Laczka et al., "Synthesis, Structure and Electron Spectra of Fused Quartz Doped with Titanium, Cerium and Neodymium".

Chemical Abstracts, vol. 89, No. 12, Sep. 18, 1978, pp. 243, 94008W, M. Sakuhana, et al., "Heat-Resistant Fibers from Metal Alcoholate".

*Primary Examiner*—Karl Group
*Attorney, Agent, or Firm*—Oblon, Spivak, McClelland, Maier & Neustadt

[57] ABSTRACT

Highly heat resistant glass fiber which comprises from 0.1 to 2.0 wt % of $Al_2O_3$, from 0.1 to 2.0 wt % of $TiO_2$, from 96 to 99.8 wt % of $SiO_2$ and not more than 0.03 wt % of the sum of alkali metal oxides and alkaline earth metal oxides.

6 Claims, 1 Drawing Sheet

HIGHLY HEAT RESISTANT GLASS FIBER AND PROCESS FOR ITS PRODUCTION

The present invention relates to highly heat resistant glass fiber and a process for its production.

E glass most commonly employed as long glass fibers, has a wide range of applications including an application as an electrical insulating material. However, its heat resistance is only at a level of 800° C. at best because of the limitation from its chemical composition. When use at a higher temperature is desired, silica glass fibers having a higher melting point are employed. As classified broadly, two types of glass are known for the silica glass fibers. Namely, one type is melt method silica glass fibers which are prepared by melting natural quartz, followed by vitrification, and the other type is so-called leached silica fibers. When both types of fibers are compared, the melt method silica glass fibers are composed of from 99.9 to 99.99 wt % of silica, while the leached silica fibers contain impurities in addition to silica, wherein the purity of silica is at a level of 99%.

On the other hand, in the stability against heat of 1,000° C. or higher, the leached silica fibers are superior. Namely, even when the leached silica fibers are maintained at 1,000° C. for 480 hours, the yarn maintains about 70% of the initial strength, whereas the strength of the melt method silica glass fibers drops to a level of at most 5%. However, when maintained at 1,100° C., even the leached silica fibers undergo precipitation of cristobalite within 48 hours, and the strength will be lowered.

It is an object of the present invention to solve the above problems inherent to the prior art.

The present invention has been made to solve the above problems and provides highly heat resistant glass fiber which comprises from 0.1 to 2.0 wt % of $Al_2O_3$, from 0.1 to 2.0 wt % of $TiO_2$, from 96 to 99.8 wt % of $SiO_2$ and not more than 0.03 wt % of the sum of alkali metal oxides and alkaline earth metal oxides.

Further, the present invention provides highly heat resistant glass fiber which comprises from 0.1 to 0.6 wt % of $Al_2O_3$, from 0.1 to 0.8 wt % of $TiO_2$, from 98.6 to 99.8 wt % of $SiO_2$ and not more than 0.03 wt % of the sum of alkali metal oxides and alkaline earth metal oxides.

BRIEF DESCRIPTION OF DRAWING

In the accompanying drawing.

Figure 1:
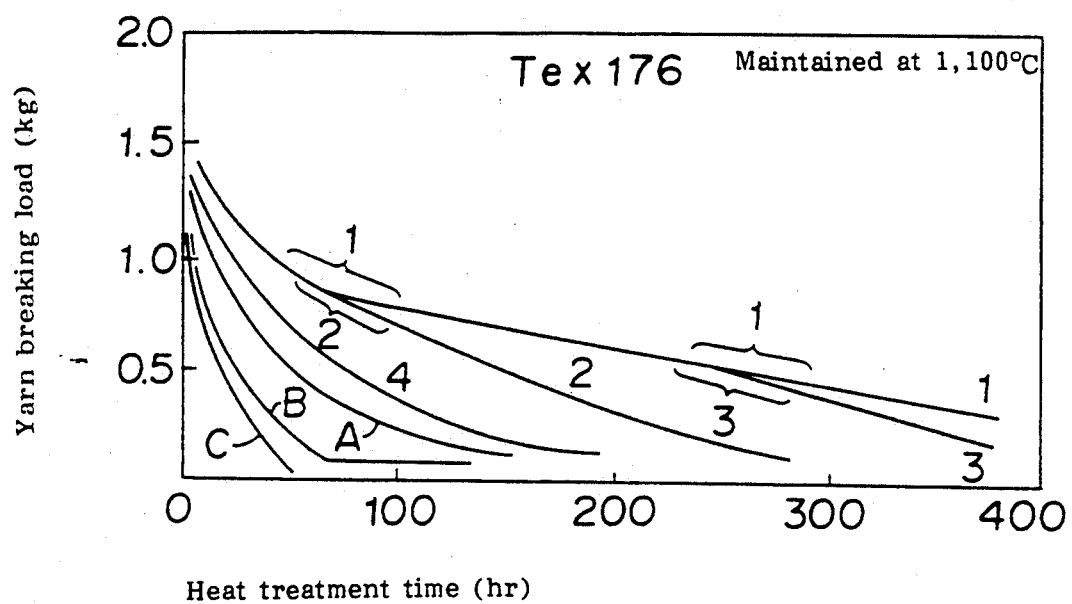
FIG. 1 is a graph showing the relation between the heat treatment time and the yarn breaking load.

When subjected to a heat of 1,000° C. or higher, glass fibers composed mainly of silica will undergo shrinkage, fusion of fibers (monofilaments) to one another and precipitation of cristobalite, whereby the tensile strength will decrease. Within a temperature range of from 1,000° to 1,100° C., these three phenomena do not necessarily simultaneously occur and the mode of occurrence varies depending upon the types of the fibers. For example, with the conventional melt method silica glass fibers, fusion of the fibers to one another occurs mainly, and with the leached silica fibers, shrinkage of fibers and precipitation of cristobalite mainly occur, whereby the tensile strength (breaking load) of the yarn decreases.

The highly heat resistant glass fibers of the present invention have been developed for the purpose of improving the heat resistance by suppressing the above-mentioned three phenomena of heat deterioration. The essential point is to restrict the contents of $Al_2O_3$ and $TiO_2$ relative to $SiO_2$ and to limit the content of alkali metal oxides and alkaline earth metal oxides. The effect of incorporation of $Al_2O_3$ to silica glass is to increase the high temperature viscosity of glass. Especially when maintained at a temperature of from 1,000° to 1,100° C., it shows high viscosity as compared with silica glass containing no $Al_2O_3$, whereby it is possible to prevent fusion of monofilaments to one another. This effect of $Al_2O_3$ appears when the glass contains from 0.1 to 2.0 wt % of $Al_2O_3$ relative to from 96 to 99.8 wt % of $SiO_2$. The effect is particularly remarkable when the glass contains from 0.1 to 0.6 wt % of $Al_2O_3$.

On the other hand, the effect of incorporation of $TiO_2$ to silica glass containing from 0.1 to 2.0 wt % of $Al_2O_3$, is to control the precipitation of cristobalite. If $TiO_2$ is not incorporated, the time until the precipitation of cristobalite starts will be quickened, and the amount of precipitation increases as the content of $Al_2O_3$ increases, when the glass is maintained at a temperature of from 1,000° to 1,100° C. The tensile strength of the yarn decreases with an increase of the amount of precipitated cristobalite. Therefore, it is important to suppress the precipitation to prevent the deterioration of the strength. The effect of incorporation of $TiO_2$ appears when the glass contains from 0.1 to 2.0 wt % of $TiO_2$. However, such an effect is particularly remarkable when the glass contains from 0.1 to 0.8 wt % of $TiO_2$ in a case where $SiO_2$ is from 98.6 to 99.8 wt % and $Al_2O_3$ is from 0.1 to 0.6 wt %.

Further, in the glass fiber of the present invention, the above-mentioned effects of $TiO_2$ and $Al_2O_3$ tend to be small if alkali metals or alkaline earth metals are present in the glass. Therefore, the total amount of alkali metal oxides and alkaline earth metal oxides is desired to be not more than 0.03 wt %, more preferably not more than 0.01 wt %.

The highly heat resistant glass fiber of the above composition is useful for various products including knitted products such as sleeves and strings, woven fabrics such as cloth and tapes, non-woven fabrics, mats, papers, chopped strands, yarns and staple fibers. Such products are suitably selected depending upon the particular purposes and the environment of use where the high heat resistance is required, whereby remarkable effects can be obtained.

Further, a heat insulating material made of the highly heat resistant glass fiber of the present invention, such as a highly heat resistant heat-insulating material made of the above-mentioned knitted product, mat, cloth, tape, paper, chopped strand or non-woven fabric, or by a combination thereof, is particularly useful.

Especially, a heat insulating collar for a semiconductor production diffusion furnace made of the highly heat resistant glass fiber of the present invention, such as a heat insulating collar for a semiconductor production diffusion furnace made of the above-mentioned knitted product, mat, cloth, tape, paper, chopped strand or non-woven fabric, or by a combination thereof, has a remarkable feature that in addition to the high heat resistance, it contains no substantial amount of impurities detrimental to semiconductors.

The present invention provides a process for producing highly heat resistant glass fiber, which comprises adding aluminum and titanium chelate compounds to a silicon alkoxide solution, reacting the mixture until the viscosity becomes to be from 10 to 200 poise (as measured at 25° C.), followed by dry spinning to form gel fiber, and sintering the gel fiber at a temperature of from 800° to 1,100° C. for a predetermined period of time.

The silicon alkoxide is not particularly restricted. However, for example, silicon tetraethoxide is suitably employed. The silicon alkoxide is dissolved in a solvent such as ethanol or methanol to obtain a solution, which is hydrolyzed to increase the viscosity and then subjected to spinning. The aluminum and titanium chelate compounds are preferably added to a solution having the silicon alkoxide preliminarily hydrolyzed.

As the aluminum chelate compound, aluminum ethyl acetacetate diisopropoxide, aluminum tris(acetylacetonate) or aluminum tris(ethylacetacetate) may, for example, be used. A chelated compound obtained by reacting a chelating agent to an aluminum alkoxide is also preferably employed. The aluminum alkoxide is not particularly restricted. However, triisopropoxyaluminum, mono-sec-butoxide isopropoxyaluminum or triethoxyaluminum may, for example, be employed.

As the titanium chelate compound, di-n-butoxybis(-triethanolaminate)titanium, isopropoxy(2-ethylhex-anediolate)titanium or di-isopropoxybis-(acetylacetonate)titanium may, for example, be employed. A chelated compound obtained by reacting a chelating agent to a titanium alkoxide may also be preferably employed. The titanium alkoxide is not particularly restricted. However, tetra-n-butoxy titanium, tetraisopropoxytitanium, tetrakis-2-ethylhexoxytitanium or tetrastearoxytitanium may, for example, be used. As the above chelating agent, a $\beta$-diketone or a $\beta$-ketonic acid ester such as acetylacetone or ethyl acetacetate, may, for example, be preferably employed.

At the time of incorporating the aluminum and titanium chelate compounds, it is preferred to add a carboxylic acid such as formic acid or acetic acid, so that the chelate compounds can thereby be readily dissolved in a solvent such as ethanol or methanol.

Now, the present invention will be described in further detail with reference to Examples. However, it should be understood that the present invention is by no means restricted to such specific Examples.

EXAMPLE 1

640 g of ethyl silicate 40 (product of Nippon Corcoat Company) was dissolved in 250 g of ethanol. To this solution, 56 g of water was added, and the mixture was maintained at 80° C. for hydrolysis. As a catalyst, nitric acid was employed. This solution was concentrated to obtain a spinning mother solution having a $SiO_2$ content of 46 wt %. To this spinning mother solution, a transparent solution obtained by mixing 2.05 g of aluminum isopropoxide, 1.85 g of titanium butoxide, 4.0 g of acetylacetone, 8.0 g of formic acid and 40 g of methanol, was added and stirred. When the viscosity of this solution became 60 poise (as measured at 25° C.), it was filled in a tank and then extruded from a spinneret having about 100 nozzles (opening diameter: about 100 μm) into atmospheric air. Extruded filaments were wouned up at a rate of 100 m/min on a winding drum, whereby gel fibers were continuously obtained. The cross section of the obtained gel fiber monofilament was oval with its longer diameter being about 20 μm.

The gel fibers were sintered at a temperature of about 900° C. to obtain silica glass fibers having a longer diameter of about 16 μm. The fibers were subjected to a chemical analysis, whereby the fibers were found to contain 99.63 wt % of $SiO_2$, 0.2 wt % of $Al_2O_3$, 0.17 wt % of $TiO_2$ and not more than 0.01 wt % of the sum of alkali metal oxides and alkaline earth metal oxides. Then, to examine the heat resistance of the silica glass fibers, a yarn having the silica glass fibers bundled to Tex 176 was maintained at 1,100° C., and after cooling to room temperature, the breaking load was measured. The results are shown by 1 in FIG. 1 showing the relation between the heat treatment time and the breaking load.

EXAMPLE 2

Highly heat resistant glass fibers were prepared in the same manner as in Example 1. 3.89 g of aluminum isopropoxide, 1.85 g of titanium butoxide, 8.0 g of acetylacetone and 16.0 g of formic acid were mixed to the spinning mother solution. The obtained glass fibers were composed of 99.45 wt % of $SiO_2$, 0.38 wt % of $Al_2O_3$ and 0.17 wt % of $TiO_2$, and the sum of alkali metal oxides and alkaline earth metal oxides was not more than 0.01 wt %. In the same manner as in Example 1, the heat resistance of the silica glass fibers was examined, and the results are shown by 2 in FIG. 1.

EXAMPLE 3

Highly heat resistant glass fibers were prepared in the same manner as in Example 1. 2.05 g of aluminum isopropoxide, 7.28 g of titanium butoxide, 4.0 g of acetylacetone and 8.0 g of formic acid were mixed to the spinning mother solution. The obtained glass fibers were composed of 99.13 wt % of $SiO_2$, 0.2 wt % of $Al_2O_3$ and 0.67 wt % of $TiO_2$, and the sum of alkali metal oxides and alkaline earth metal oxides was not more than 0.01 wt %. In the same manner as in Example 1, the heat resistance of the silica glass fibers was examined, and the results are shown by 3 in FIG. 1.

EXAMPLE 4

Highly heat resistant glass fibers were prepared in the same manner as in Example 1. 16.4 g of aluminum isopropoxide, 16.3 g of titanium butoxide, 40.0 g of acetylacetone and 140.0 g of formic acid were mixed to the spinning mother solution. The obtained glass fibers were composed of 96.9 wt % of $SiO_2$, 1.6 wt % of $Al_2O_3$ and 1.5 wt % of $TiO_2$, and the sum of alkali metal oxides and alkaline earth metal oxides was less than 0.01 wt %. In the same manner as in Example 1, the heat resistance of the silica glass fibers was examined, and the results are shown by 4 in FIG. 1.

COMPARATIVE EXAMPLE A

Highly heat resistant glass fibers were prepared in the same manner as in Example 1. 6.14 g of aluminum isopropoxide, 12.0 g of acetylacetone and 24.0 g of formic acid were mixed to the spinning mother solution. The obtained glass fibers were composed of 99.4 wt % of $SiO_2$ and 0.6 wt % of $Al_2O_3$. In the same manner as in Example 1, the heat resistance of the silica glass fibers was examined, and the results are shown by A in FIG. 1.

COMPARATIVE EXAMPLE B

Highly heat resistant glass fibers were prepared in the same manner as in Example 1. 3.08 g of aluminum isopropoxide, 5.44 g of titanium butoxide, 0.48 g of calcium butoxide, 6.0 g of acetylacetone and 12.0 g of formic acid were mixed to the spinning mother solution. The obtained glass fibers were composed of 99.16 wt % of $SiO_2$, 0.3 wt % of $Al_2O_3$, 0.5 wt % of $TiO_2$ and 0.04 wt % of CaO. In the same manner as in Example 1, the heat resistance of the silica glass fibers was examined, and the results are shown by B in FIG. 1.

COMPARATIVE EXAMPLE C

Highly heat resistant glass fibers were prepared in the same manner as in Example 1. Aluminum isopropoxide and titanium butoxide were not incorporated. The obtained glass fibers were composed of 99.999 wt % of $SiO_2$. In the same manner as in Example 1, the heat resistance of the silica glass fibers was examined, and the results are shown by C in FIG. 1.

As shown in FIG. 1, the highly heat resistant glass fibers of the present invention in Examples 1 to 4 exhibit far superior heat resistance as compared with the glass fibers obtained in Comparative Examples A, B and C.

The highly heat resistant glass fibers of the present invention have a high viscosity at a high temperature as compared with conventional products, and the monofilaments do not fuse to one another even at a temperature as high as from 1,000° to 1,100° C. Further, they have a characteristic such that deterioration of the strength at a high temperature is little. Thus, they have excellent characteristics suitable as a material to be used at a high temperature, such as a heat insulating material.

Further, the highly heat resistant glass fibers of the present invention contain no substantial impurities detrimental to semiconductors, and a heat-insulating collar for a semiconductor production diffusion furnace made of the highly heat resistant glass fibers of the present invention, will not be fused or hardened and has not only a flexibility and a heat-insulating property but also an excellent characteristic that it is substantially free from staining semiconductors.

We claim:

1. Highly heat resistant glass fiber which consists essentially of from 0.1 to 2.0 wt % of $Al_2O_3$, from 0.1 to 2.0 wt % of $TiO_2$, from 96 to 99.8 wt % of $SiO_2$ and not more than 0.03 wt % of the sum of alkali metal oxides and alkaline earth metal oxides.

2. The highly heat resistant glass fiber according to claim 1, wherein the sum of alkali metal oxides and alkaline earth metal oxides is not more than 0.01 wt %.

3. The highly heat resistant glass fiber according to claim 1, which consists essentially of from 0.1 to 0.6 wt % of $Al_2O_3$, from 0.1 to 0.8 wt % of $TiO_2$, from 98.6 to 99.8 wt % of $SiO_2$ and not more than 0.03 wt % of the sum of alkali metal oxides and alkaline earth metal oxides.

4. The highly heat resistant glass fiber according to claim 3, wherein the sum of alkali metal oxides and alkaline earth metal oxides is not more than 0.01 wt %.

5. A heat insulating material formed of the highly heat resistant glass fiber as defined in claim 1.

6. A heat insulating collar for a semiconductor production diffusion furnace, which is formed of the highly heat resistant glass fiber as defined in claim 1.

* * * * *